United States Patent
Berkhout et al.

(10) Patent No.: US 10,243,533 B1
(45) Date of Patent: Mar. 26, 2019

(54) AUTOMATIC LOOP GAIN CALIBRATION IN AMPLIFICATION CIRCUITS

(71) Applicant: NXP B.V., Eindhoven (NL)

(72) Inventors: Marco Berkhout, Tiel (NL); Fred Mostert, Horssen (NL); Massimo Ciacci, Den Bosch (NL); Mattheus Johan Koerts, Arnhem (NL); Martin Kessel, Dresden (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/891,790

(22) Filed: Feb. 8, 2018

(51) Int. Cl.
*H03G 3/30* (2006.01)
*H03F 3/183* (2006.01)
*H03F 3/217* (2006.01)
*H03G 3/02* (2006.01)
*H04R 3/00* (2006.01)

(52) U.S. Cl.
CPC ............ *H03G 3/301* (2013.01); *H03F 3/183* (2013.01); *H03F 3/217* (2013.01); *H03F 2200/03* (2013.01); *H03F 2200/171* (2013.01); *H04R 3/00* (2013.01)

(58) Field of Classification Search
USPC ........................................ 330/251, 10, 207 A
See application file for complete search history.

(56) References Cited

U.S. PATENT DOCUMENTS

| | | | |
|---|---|---|---|
| 7,202,805 B2 | 4/2007 | Sherry et al. | |
| 8,860,478 B2 | 10/2014 | Chen et al. | |
| 9,941,853 B2* | 4/2018 | Mostert ................. | H03F 3/2173 |
| 2015/0341158 A1 | 11/2015 | Wu et al. | |

OTHER PUBLICATIONS

Schinkel et al., "A Multiphase Class-D Automotive Audio Amplifier With Integrated Low-Latency ADCs for Digitized Feedback After the Output Filter," IEEE Journal of Solid-Satete Circuits, vol. 52, No. 12 (Dec. 2017).

\* cited by examiner

*Primary Examiner* — Hieu P Nguyen
(74) *Attorney, Agent, or Firm* — Rajeev Madnawat

(57) ABSTRACT

Aspects are directed to an amplifier circuit including a signal processing circuit and a calibration circuit. In certain specific embodiments, the signal processing circuit includes a signal combiner and a closed-loop feedback path, and the signal processing circuit is designed to provide a loop transfer function for a derived signal partly representing contributions from an audio input signal, a control or pilot signal having a target frequency range, and a calibration signal. The signal combiner is designed to combine aspects of the control or pilot signal and aspects of the audio input signal, and the calibration circuit is designed to adjust an effective gain of the derived signal in response to whether a unity-gain frequency of a signal in the closed-loop feedback path, as provided via the loop transfer function, is higher or lower than the target frequency range. Consistent therewith and in yet more specific embodiments, such an amplifier circuit can define the target frequency range relative to the transfer function and an associated unity-gain frequency.

17 Claims, 12 Drawing Sheets

400

AUTOMATIC LOOP GAIN CALIBRATION IN AMPLIFICATION CIRCUITS

OVERVIEW

Aspects of various embodiments are directed to controlling the operation of an amplifier having a closed-loop feedback path which is important for performance of the amplifier.

An appreciation of such performance might be best understood using the specific example of an audio amplifier in which the acquisition and reproduction of audio signals, involving some of the first applications of electronic circuits, continues to improve. Nowadays, audio electronics are ubiquitous and can be found in television and hi-fidelity stereo devices, car audio systems and more recently in cellular phones and many other portable applications. The vast majority of these electronics is in the form of integrated circuits.

A specific example of an audio amplifier is an integrated circuit which employs a class-D audio amplifier design with a complex digital feedback architecture that includes external LC low-pass filtering circuits. The LC low-pass filter is connected between the switching outputs of the amplifier's power stage and the loudspeaker load in order to suppress the high frequency content of PWM (Pulse-Width Modulated) signals passing through the power stage. The voltage across the loudspeaker load is converted to the digital domain with an ADC and fed back to a digital loop filter as a loop filter having a closed-loop feedback path.

Controlling the operation of an amplifier having such a closed-loop feedback path is important for performance of the amplifier. Consider one specific version, in which the loop filter consists of two parts: a high-order digital filter having a high gain in the audio bandwidth and a first-order behavior around the unity-gain frequency of the loop and having an LC-compensation filter that is meant to cancel the transfer of the external LC low-pass filter. Ideally, the LC-compensation filter might have two zeros that exactly cancel the two poles of the LC low-pass filter (where "poles" and "zeros" are in reference to terminology used for characterizing a Bode plot).

While such ideal cancellation and control seems to be attainable in the ideal or mathematical sense, attempting to implement such control and performance using less-than-ideal circuit components can be problematic. There are numerous issues in these regards. One issue is the lack of consistencies in the specification tolerances ensuing from the manufacture of components used for such amplifiers. Another issue pertains to the increasing costs of such components which provide enhanced/tighter specification tolerances. Moreover, when such amplifiers are implemented as closed-loop class-D audio amplifiers, previously-implemented circuits are known to manifest limited stability range which can be caused by a large spread in values of external inductor and capacitor values such as presented by load circuits connected at the output ports of such amplifiers.

These and other matters have presented challenges to the control and design of such amplification circuits for a variety of applications, including but not necessarily limited to those directed to applications involving closed-loop class-D audio amplifiers.

Various example embodiments are directed to issues such as those addressed above and/or others which may become apparent from the following disclosure. For example, according to certain embodiments, the unity-gain frequency of a feedback loop in an amplifier having a closed-loop feedback path is regulated by including a small control signal (e.g., target frequency signal or pilot-tone) into the feedback loop. By comparing signals (or signal power) before and after inclusion of the control signal, an appropriate amount of calibration can be provided for maintaining proper control in the feedback path.

In more specific embodiments, the unity-gain frequency of a feedback loop in an audio amplification circuit is controlled within a narrow target range (e.g., regulated to a fixed value) by adding a small pilot-tone at a target frequency into the loop. The signal power in the forward feed path (which processes the input audio signal) is compared before and after the inclusion or summation of the pilot-tone for determining how to calibrate the closed-loop feedback path. In certain instances, the pilot tone is a signal carrying a single target frequency, and in other instances, the pilot tone is a signal within a target frequency range, or is a combination of two or more specific frequencies as may be appropriate depending on how the calibration circuit is designed.

In yet more specific example embodiments, aspects are directed to an amplifier circuit including a signal processing circuit and a calibration circuit. In such embodiments, the signal processing circuit includes a signal combiner and a closed-loop feedback path, and the signal processing circuit is designed to provide a loop transfer function for a derived signal representing (at least in part) contributions from an audio input signal, a control or pilot signal having a target frequency range, and a calibration signal. The signal combiner is designed to combine aspects of the control or pilot signal and aspects of the audio input signal, and the calibration circuit is designed to adjust an effective gain of the derived signal in response to whether a unity-gain frequency of a signal in the closed-loop feedback path, as provided via the loop transfer function, is higher or lower than the target frequency range. Consistent therewith and in yet more specific embodiments, such an amplifier circuit can define the target frequency range relative to the transfer function and an associated unity-gain frequency.

In other specific example embodiments, such amplification circuits can include the calibration circuit being configured and arranged to maintain stability of the closed-loop feedback path by adjusting the gain of the derived signal, and for certain applications such circuits can be implemented as class-D audio amplifiers in which the amplification is realized in the form of an electronic amplifier by using amplifying devices (transistors, oftentimes field-effect transistors) operating as electronic switches.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 1A and 1B represent a block diagram of an example amplification circuit, in accordance with the present disclosure, which FIG. 1B illustrates example circuitry for implementing a (loop) transfer illustrated in FIG. 1A;

Also consistent with the above-characterized examples and also in accordance with the present disclosure.

Consistent with a system (amplification circuit) of the type implemented in a manner consistent with FIG. 8 and also in accordance with the present disclosure.

Consistent with the illustrated aspects shown in FIGS. 8 and 9 (and also in accordance with the present disclosure)

Figure 1A:
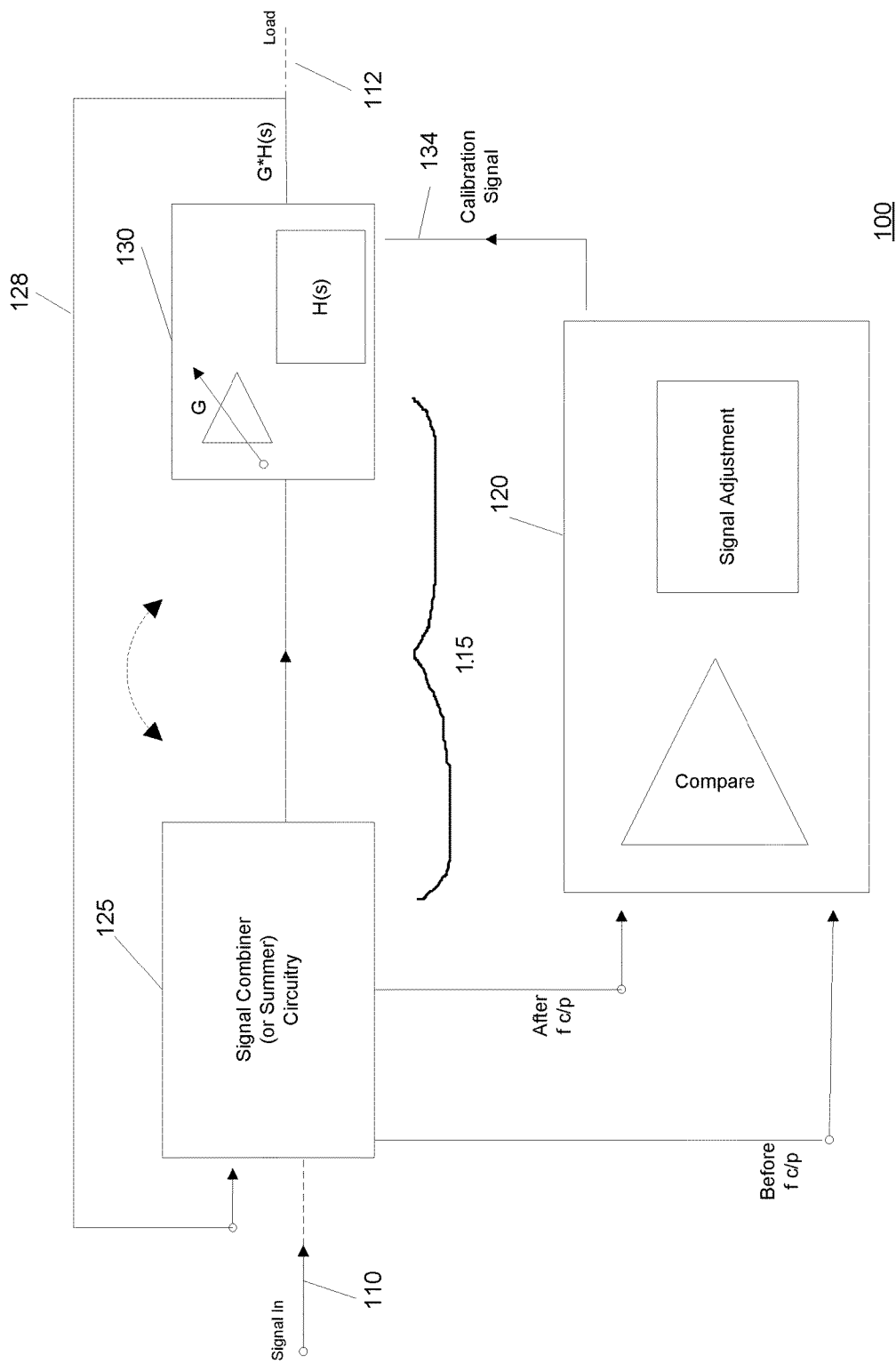

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods which use and control amplifiers by implementing signal amplification circuitry in the form of electronic switches and with a calibration circuit acting in conjunction with a control signal in a feedback path to control the signal-amplification gain. In certain implementations, aspects of the present disclosure have been shown to be beneficial when used in the context of a class-D audio amplifier. In some more specific non-limiting examples, embodiments of the present disclosure concern class-D audio amplifiers as used in connection with televisions, hi-fidelity stereos, mobile phones, car audio systems, tablets, stand-alone Wi-Fi communicative speakers and other portable applications. While not necessarily so limited, various aspects may be appreciated through the following discussion of non-limiting examples which use exemplary contexts.

Accordingly, in the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Consistent with the instant disclosure, one specific example embodiment is directed to an amplifier circuit having a signal processing circuit which receives and processes a digitized version of an audio signal by developing a derived signal which represents contributions from the audio (input) signal, a control (or pilot) signal, and a calibration signal. The amplifier circuit includes both the circuitry to generate the pilot signal and the (calibration) circuitry to adjust an effective gain of the derived signal in response to whether a unity-gain frequency of a signal in a feedback path of the amplifier circuit, is higher or lower than the target frequency range. As discussed and illustrated in various example circuits, the contributions from the audio signal, the pilot signal, and the calibration signal can be combined in different ways for operating in the signal processing circuit in order to calibrate and provide the gain adjustment.

In these and other specific example embodiments, such amplification circuits can include the calibration circuitry being configured and arranged to maintain stability of the closed-loop feedback path by adjusting the gain of the derived signal. For certain applications, such circuits can be implemented as class-D audio amplifiers in which the amplification is realized in the form of an electronic amplifier by using amplifying devices (transistors such as field-effect transistors) operating as electronic switches.

Figure 1B:
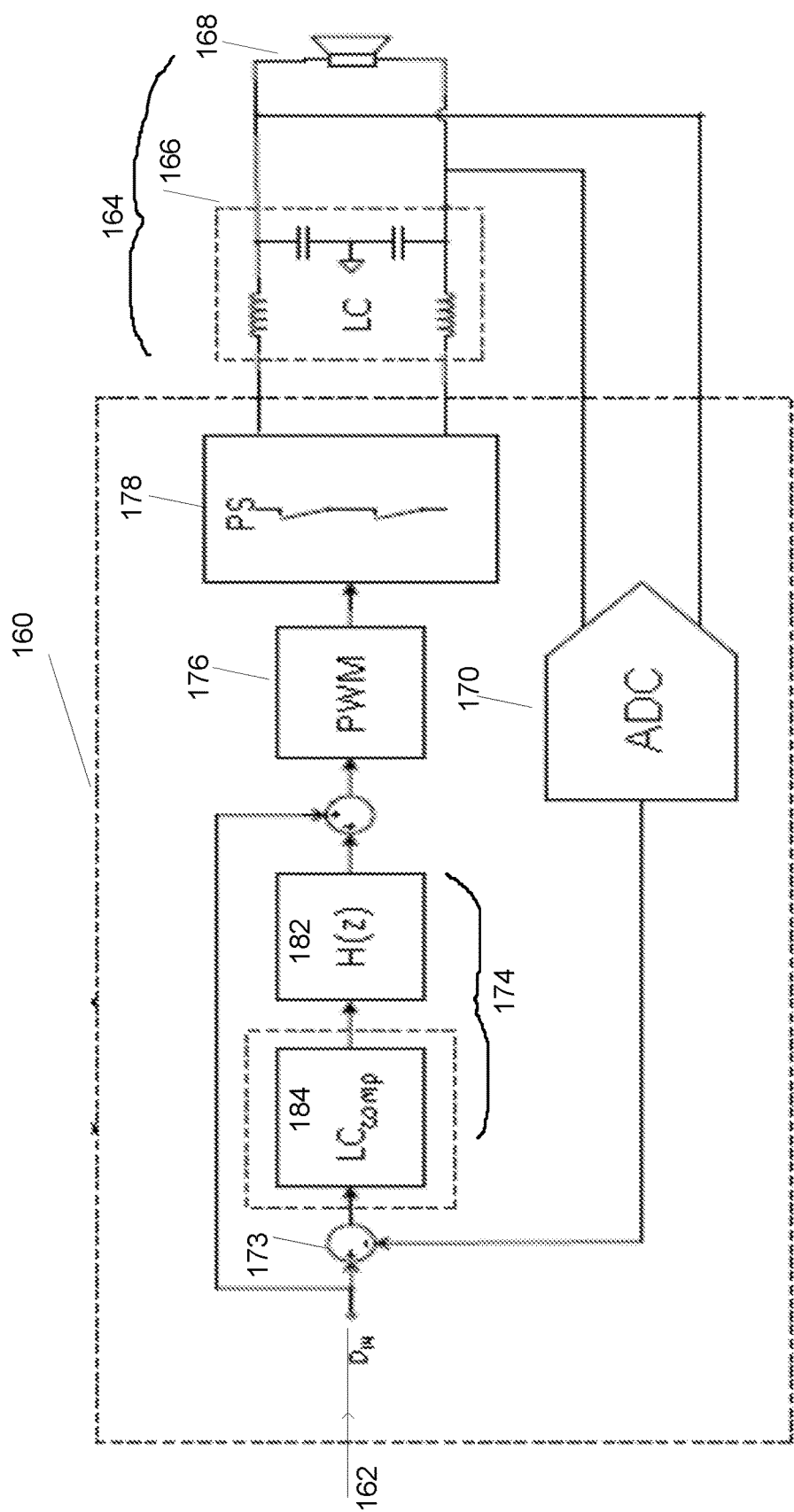

Consistent with the above-discussed specific example embodiment, FIGS. 1A and 1B illustrate a block diagram of an audio amplifier circuit 100 configured and arranged between an audio input signal 110 and a load 112. The audio amplifier circuit 100 includes a signal processing circuit 115 and a calibration circuit 120. In this particular example, the signal processing circuit 115 includes a signal combiner 125 and a closed-loop feedback path 128, and circuitry 130 for providing a loop transfer function for a derived signal representing contributions from an audio input signal, a control or pilot signal having a target frequency range (internal to the signal combiner 125), and a calibration signal 134. In this particular example, the derived signal can be viewed at any given moment as a signal (including each of these contributions) being developed by the signal processing circuit 115; for example, the derived signal can be considered as being at the output of the circuitry 130. The signal combiner 125 is designed to combine aspects of the calibration signal 134 and aspects of the audio input signal 110.

The calibration circuit 120 is designed to adjust, in response to the calibration signal 134 affecting a signal path in the signal processing circuit 115, an effective gain of the derived signal in response to whether a unity-gain frequency of a signal in the closed-loop feedback path, as provided via the loop transfer function circuitry 130, is higher or lower than the target frequency range. For example, the calibration circuit 120 can be configured and arranged to adjust an effective gain of the derived signal in response to whether a unity-gain frequency of a signal in the closed-loop feedback path, as provided via the loop transfer function, is higher or lower than the target frequency range.

The loop transfer function circuitry 130 can be implemented using a variety of different circuits. With the audio amplifier circuit 100 defining the target frequency range relative to the transfer function and an associated unity-gain frequency, one implementation of the circuitry 130 is exemplified in FIG. 1B as circuitry 160. With reference to FIG. 1B, circuitry 160 is shown being configured and arranged between an audio input signal in digital form (DIN) 162 and an external load 164, In this instance, the load 164 is a loudspeaker load including or coupled to an LC low-pass filter 166 and an audio speaker 168. As shown in the dashed lines, the circuitry 160 includes a digital feedback architecture with feedback from the (audio) signals between the LC low-pass filter 166 and the audio speaker 168. In this manner, the voltage across the load is converted to the digital domain with an ADC 170 and fed back to a summer circuit 173 and a digital loop filter 174. From the digital loop filter 174, signal processing flows to a Pulse-Width Modulated (PWM) circuit 176 as is conventional for class-D switching amplifiers, and from the output of the PWM circuit 176, to a power stage 178 (e.g., switching power transistors) and to the LC low-pass filter 166 for suppressing the high frequency content of the (PWM) signal.

The digital loop filter 174 consists of two parts: a high-order digital filter H(z) 182 that has high gain in the audio bandwidth and a 1st order behavior around the unity-gain frequency JUG of the loop and an LC compensation filter (LCcomp) 184 that is designed to cancel the transfer of the external LC low-pass filter. Ideally, the LC compensation filter has two zeros that exactly cancel the two poles of the LC low-pass filter.

Figure 2:
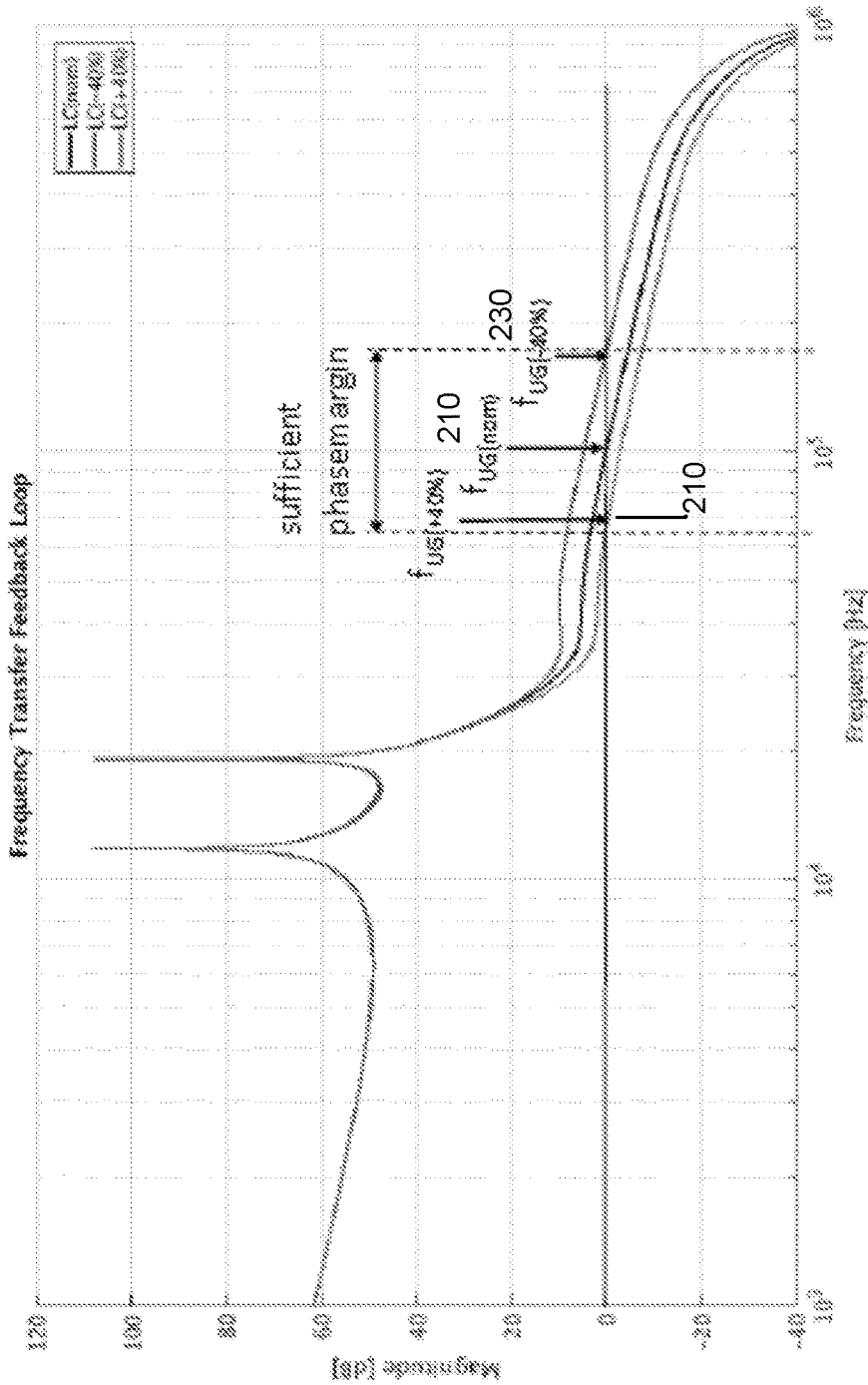
FIG. 2 is a graph illustrating an exemplary set of data for a loop transfer design and showing the effect of component spread on unity-gain frequency for an amplification circuit of the type implemented in a manner consistent with the block diagram exemplified in connection with FIGS. 1A and 1B, in accordance with the present disclosure.

FIG. 2 illustrates a non-limiting example graph 200 of the overall loop transfer of the feedback loop shown in connection FIGS. 1A and 1B. The graph 200 has a 5th order loop transfer with one pole a DC and two resonators at the edge of the audio frequency band that produce a minimum loop gain of 50 dB in the entire audio band. The three curves in FIG. 2 depicted as 210, 220 and 230, show the effect of LC component spread on the frequency transfer of the complete feedback loop. In the nominal case (black plot 210) the unity-gain frequency fUG=100 kHz and the 0-dB line is crossed with a 1st order (20 dB/decade) slope. This results in a stable closed loop transfer with sufficient phase margin. In case the value of the L*C product is 40% larger than nominal, as in plot 210, the unity-gain frequency shifts down to around 68 kHz. In case the value of the L*C product is 40% smaller than nominal, as in plot 230, the unity-gain frequency shifts to around 175 kHz. As long as the unity-gain frequency of the feedback loop stays within the boundaries indicated with the dashed lines in FIG. 2, the 0-dB line is crossed with sufficient phase margin to yield a stable closed loop response. This sets a limit on the acceptable spread of the values of the inductor and capacitor in the LC low-pass filter.

In specific (e.g., common consumer-directed audio) applications where specifications on the values of the impedance components (inductors and capacitors) can vary widely, the spread on realistic inductor and capacitor values can be so large that the L*C product can easily exceed ±40% (plus or minus forty percent). This is because on top of the production tolerance of the components their values are also dependent on noncontrollable factors including, for example, applied voltage for capacitors, saturation of the inductors, temperature, aging, mechanical stress, humidity. Consequently, the feedback loop would be running the risk of becoming unstable. From the graph 200 shown in FIG. 2 and in connection with discoveries of the instant disclosure, if the unity-gain frequency of the loop transfer is higher or lower than the nominal value, correction is realized with circuitry which causes the curve to move down or up such that the crossing with the 0-dB axis is at the nominal unity-gain frequency again. According to specific example embodiments, this circuitry is implemented to decrease or increase the DC-gain of the loop transfer and by adjusting this DC-gain, the feedback loop handles a much wider range in component spread without becoming unstable.

Figure 3:
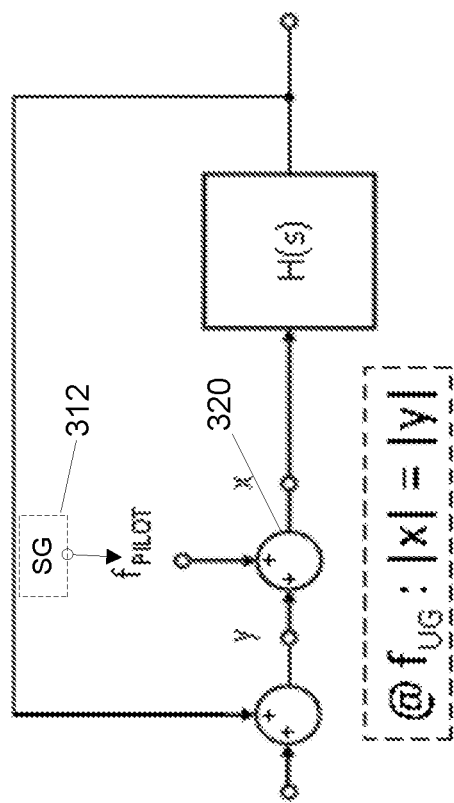
FIG. 3 shows a system including transfer function H(s) with frequency transfer characteristics similar to the loop transfer data shown in connection with FIG. 2.

Turning now to FIG. 3, signal processing flow is provided in the form of a system H(s) with a frequency transfer similar to the loop transfer shown in FIG. 2 (with a monotonously decreasing first order part around the 0-dB axis). When the input signal x is a sine at exactly the unity-gain frequency of H(s), then the output signal y has the exact same magnitude as input signal x, only the phase will be different. A target frequency signal is provided (e.g., by a signal generator (SG) 312) and for injecting into the loop by way of a signal combiner (or adder) 320. Accordingly and consistent with the instant disclosure, the target frequency signal corresponds to the previously-noted control or pilot signal, and is thereby combined with the processed signal ("y") in order to indicate whether the unity-gain frequency of the loop is higher or lower than the target frequency.

First assume the input signal of the feedback loop shown in FIG. 3 is zero. If the frequency of the pilot tone is exactly at the unity-gain frequency of H(s) then the magnitude of the signal y just before the adder and signal x after the adder are equal. If the frequency of the pilot tone is lower than the unity-gain frequency then the magnitude of signal y at that frequency will be larger than the magnitude of signal x. Conversely, if the frequency of the pilot tone is higher than the unity-gain frequency of H(s) then the magnitude of signal y at that frequency will be smaller than the magnitude of signal x.

Figure 4:
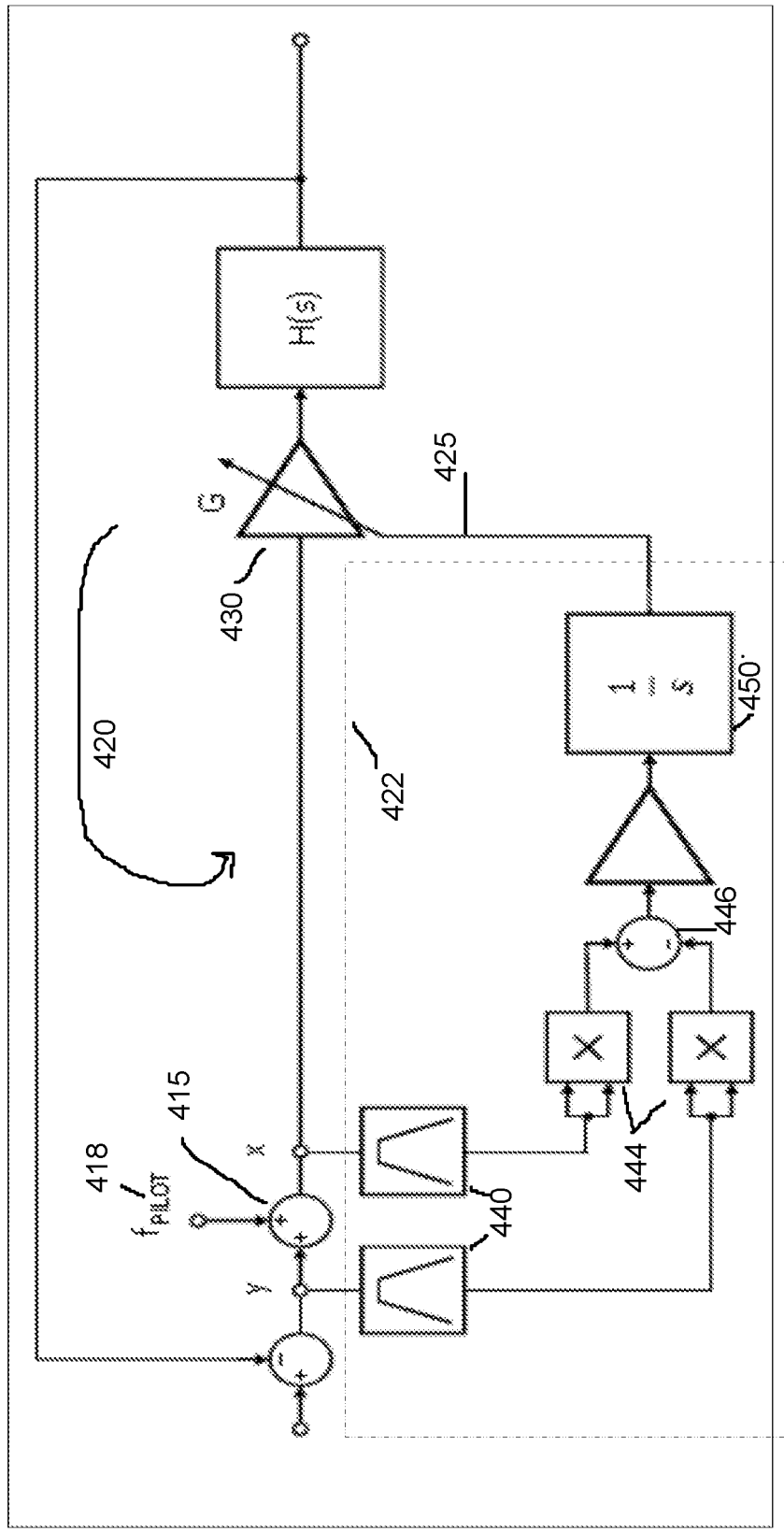
FIG. 4 is a more-specific system-level diagram illustrating an example amplification circuit, in accordance with the present disclosure.

Consistent with the instant disclosure, FIG. 4 is one of various examples of an amplification circuit 400 with a specific approach in these regards. The amplification circuit 400 has a signal combiner (or adder) 415 configured and arranged to inject such a control or pilot signal 418 into a loop 420, to reveal whether the unity-gain frequency of the loop 420 is higher or lower than the target frequency. A comparison/calibration circuit 422 is included to provide a calibration signal 425, which drives a gain/amplification circuit 430 in response to this indication, for gain calibration of the loop 420.

As shown in the loop 420 of FIG. 4, the signals x and y are first filtered by narrow-band bandpass filters 440 centered around the frequency of the pilot tone ($f_{PILOT}$) to filter out all other frequency components. Both signals are squared (multipliers 444) to determine the signal power of x and y. The squared signals are then subtracted at comparator 446 and then amplified and fed to an integrator 450 that generates the calibration signal 425 for controlling the variable gain ("G") amplification circuit 430 inside the main feedback loop. The loop transfer of the main feedback loop now becomes G*H(s). If $f_{PILOT}$ is exactly at the unity-gain frequency of G*H(s) then the signal powers of y and x at that frequency are equal and the signal going into the integrator averages out to zero. Consequently, the output of the integrator and the variable gain G remain substantially unchanged. If $f_{PILOT}$ is below the unity-gain frequency of G*H(s) then the signal power of y at that frequency is higher than the signal power of x. In this case the average input of the integrator is negative and the output of the integrator and the variable gain G decreases until the unit-gain frequency of G*H(s) equals the frequency of the pilot-tone $f_{PILOT}$. Conversely, if $f_{PILOT}$ is above the unity-gain frequency of G*H(s) then the signal power of y at that frequency is lower than the signal power of x. In this case the average input of the integrator is positive and the output of the integrator and variable gain increases until the unit-gain frequency of G*H(s) equals the frequency of the pilot-tone $f_{PILOT}$. The speed of convergence of the loop calibration can be controlled with the magnitude of the pilot tone and the gain of the integrator.

In connection with the instant disclosure, it has also been discovered that while the input signal of the feedback loop might be assumed as needing to be maintained at zero, gain calibration as exemplified with FIGS. 1-4 also works fine in the presence of various types of input signals such as those having signal frequencies that do not interfere with the pilot-tone. For example, in the case where the unity-gain frequency is chosen much higher than the highest signal frequency in the system. Moreover, if the loop gain at signal frequencies is high then the magnitude of the signal at the input of H(s) is negligibly small and no significant mixing occurs between the signal components and pilot tone. In fact, it has also been discovered that as long as the pilot tone is significantly higher than the other spectral components, the loop calibration works correctly even without the bandpass filters. This latter condition can be achieved with different architectures including, for example, those discussed herein as in FIG. 4 and in connection with the following illustrated embodiments.

Figure 5:
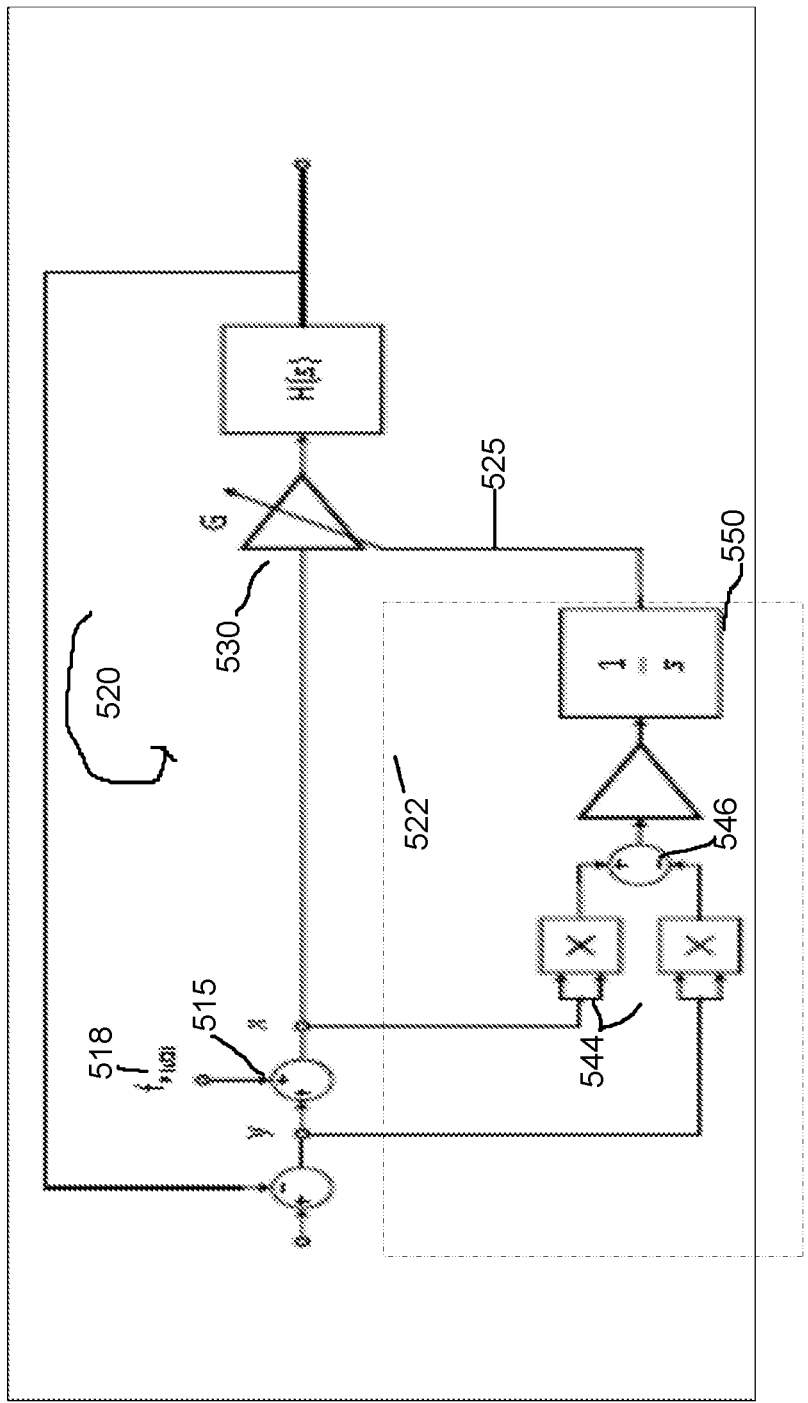
FIG. 5 is another more-specific system-level diagram illustrating an example amplification circuit, in accordance with the present disclosure.

As one such example, reference is made to FIG. 5 which is shown to largely correspond in terms of signal-processing operation and structure with function one shown in FIG. 4. As in FIG. 4, the pilot-tone in FIG. 5 is added at the beginning of the forward path G*H(s) in the loop (where the signal frequencies are suppressed by the loop gain). Also as in FIG. 4, FIG. 5 includes similar reference numerals for corresponding labeling of related signals/circuitry such as indicated by the control signal or pilot tone 418/518, the adder 415/515, the gain-amplification circuit 430/530, the integrator 450/550, and the multiplier circuits 444/544. However, bandpass filters 440 of FIG. 4 are not used in the architecture of FIG. 5.

Figure 6:
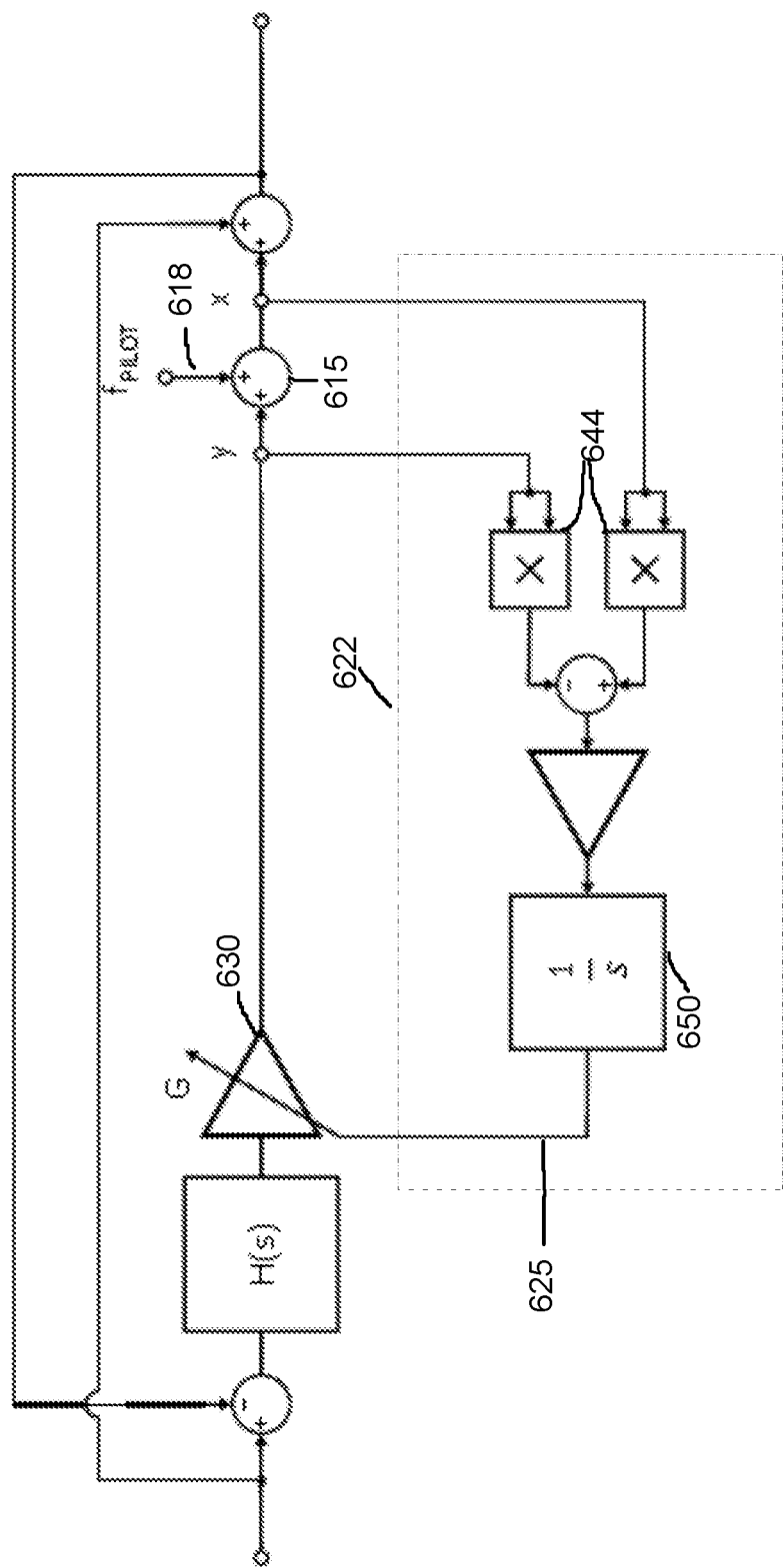
FIG. 6 is yet another more-specific system-level diagram illustrating an example amplification circuit, in accordance with the present disclosure.

Also largely consistent with the example design of FIG. 5 (also as depicted with related reference numerals for corresponding circuitry such as with FIGS. 4 and 5 including, for example, the integrator 450/550/650), FIG. 6 shows another alternative which is to add such a control signal or pilot tone at the end of the forward path G*H(s) and add a feedforward path to suppress the signal frequencies as shown at in FIG. 6. In both cases the magnitude of the signal components going through the pilot-tone adder are negligible and do not affect the calibration loop.

Figure 7:
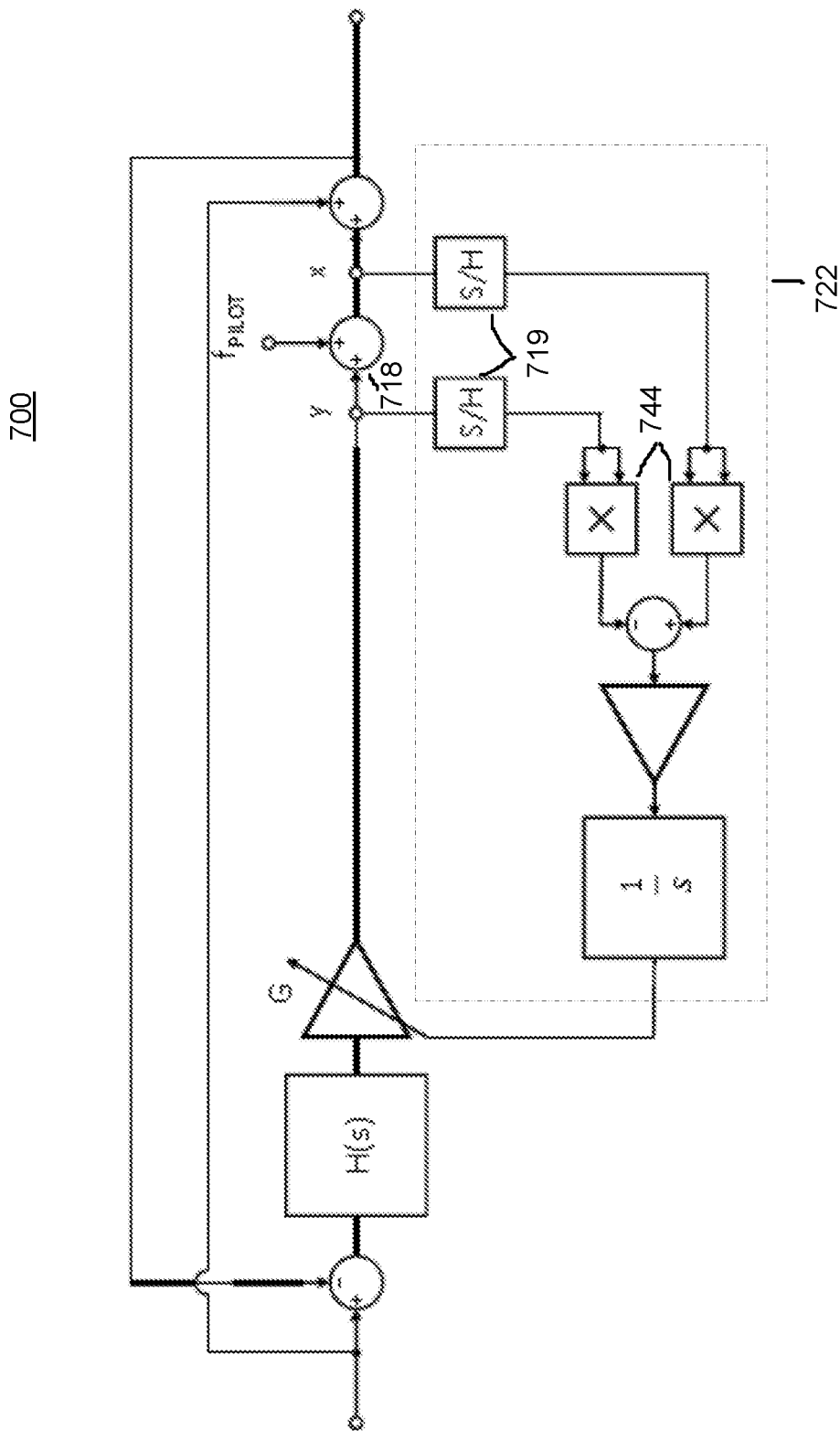
FIG. 7 is yet another more-specific system-level diagram illustrating an example amplification circuit, in accordance with the present disclosure.

FIG. 7 shows yet another alternative design 700 which also largely corresponds with the example design of FIG. 6 (also as depicted with related reference numerals for corresponding circuitry as discussed above for FIGS. 4, 5 and 6). In FIG. 7, however, the design includes respective sample-and-hold (S/H) circuits 719 on either side of the (pilot tone) adder 718, with the S/H circuits 719 being configured to sample, hold and feed multipliers 744 before integration.

In connection with each of the designs shown in FIGS. 6 and 7, the difference between the signals y and x in the loop is the pilot tone that is added in between. In this scenario, the other frequencies in the signals are identical and have identical signal power. This also remains true when the signals go through a sample-and-hold (S/H) circuit before the multipliers as shown in FIG. 7. In such designs, there can be aliasing because of the S/H operation but this does not significantly affect the operation of the calibration loop as long as not too much signal energy folds back onto the pilot-tone frequency $f_{PILOT}$. As such the gain calibration look can be made very hardware efficient, using time multiplexing to do all multiplications with one multiplier (e.g., by way of a microcomputer or logic in FPGA circuitry), even for multiple channels.

Figure 8:
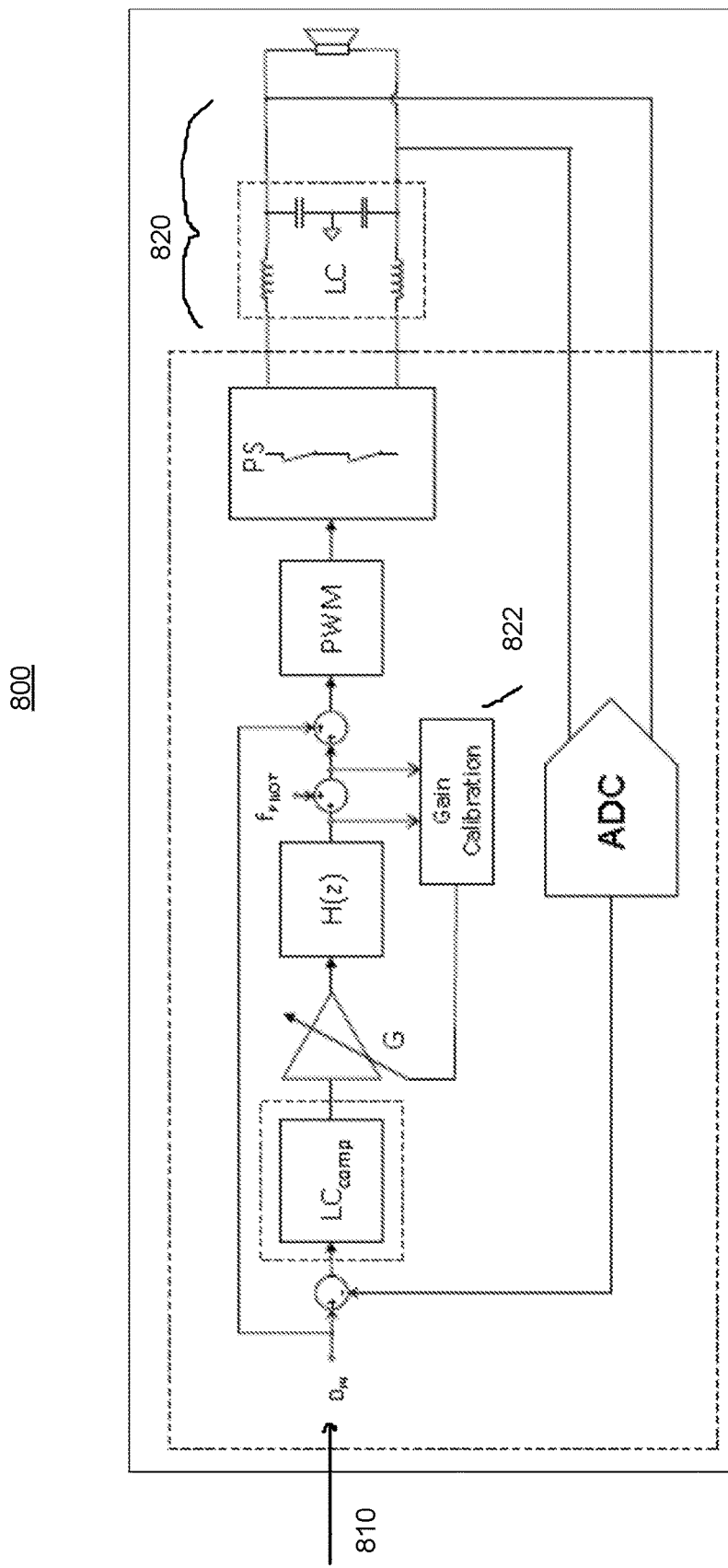
FIG. 8 is another even more-specific system-level diagram illustrating an example class-D audio amplification circuit, in accordance with the present disclosure.
Figure 9:
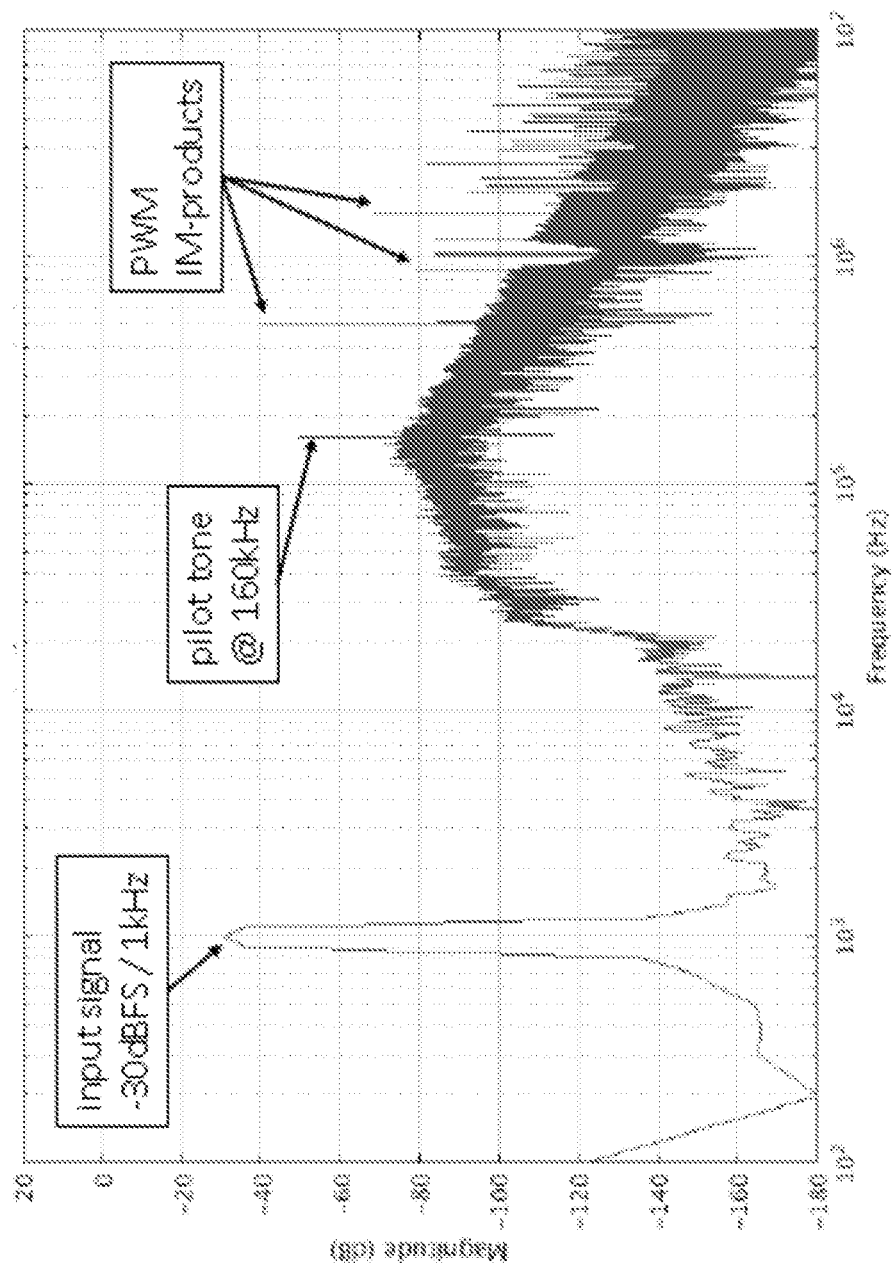
FIG. 9 shows data corresponding to the frequency spectrum of the signal across the load with the calibration active.

With reference to FIGS. 8 and 9, another design 800 is illustrated as specific to an application involving amplification of a digital audio signal 810 for a loudspeaker load as depicted at 820 of FIG. 8. FIG. 8 shows a block diagram of a class-D audio amplifier, similar to that shown in FIG. 1, and outfitted with a gain calibration loop 822 as described previously. The frequency spectrum of the signal across the load with the calibration active is shown in FIG. 9. In this case, the amplifier is driven with a 1 kHz sinewave at −30 dB of the amplifier's full scale range. As can be seen, the (quantization) noise in the audio bandwidth is suppressed to a very low value by the high loop gain in that frequency range. Just above the audio bandwidth, the noise increases sharply, following the inverse of the loop transfer as discussed earlier in connection with FIG. 2. Clearly visible is the pilot tone at 160 kHz which is the target unity-gain frequency in this case. This frequency coincides with the peak of the quantization noise. At higher frequencies, the Inter-Modulation (IM) products between the input signal and PWM carrier and harmonics can be seen.

Figure 10:
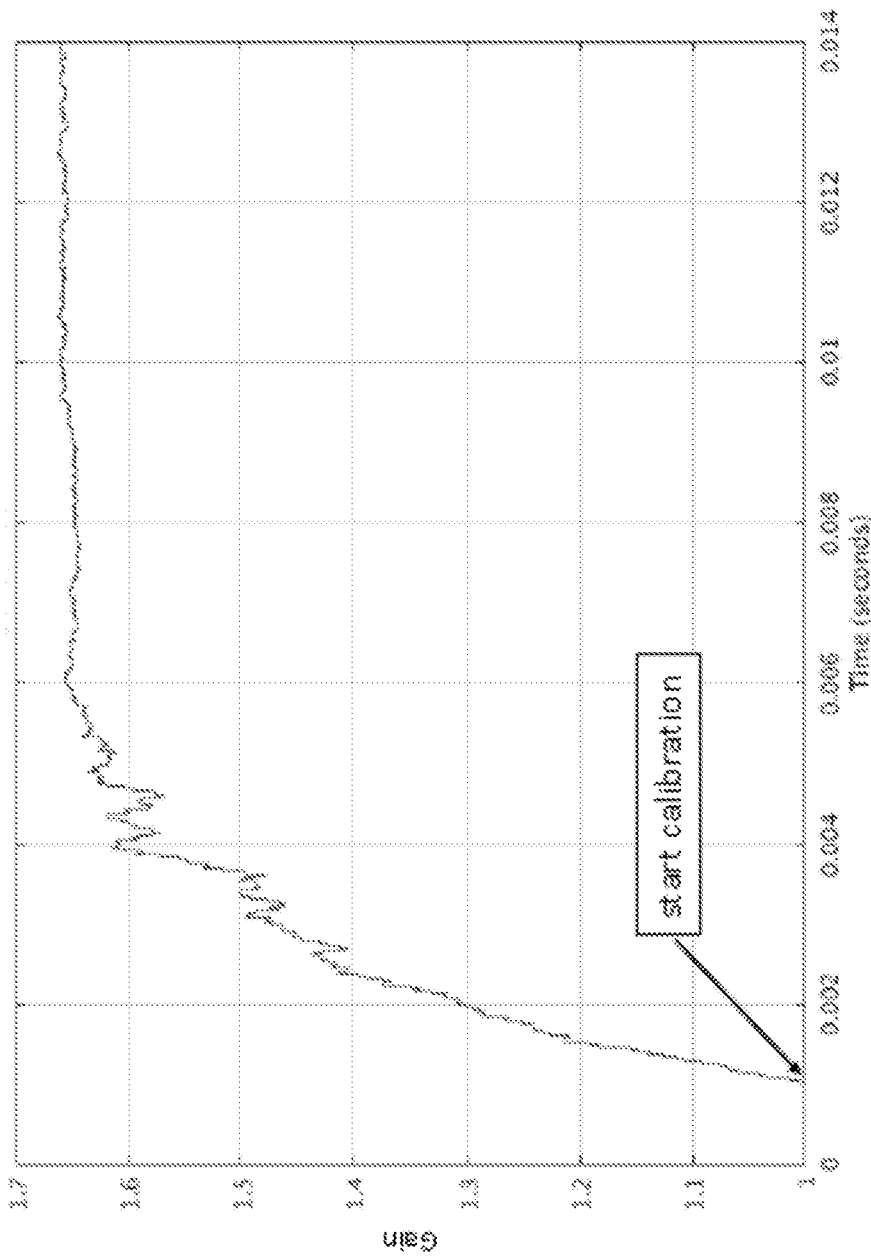
FIG. 10 shows data corresponding to the settling of the output G of the gain calibration loop.

FIG. 10 shows the settling of the output G of the gain calibration loop for a design such as 800 of FIG. 8. The initial value of G is unity and the calibration loop is started at 1 ms. As can be seen the value of G converges smoothly to a value of about 1.66. At this value, the unity-gain frequency of the loop transfer matches the pilot-tone frequency. The value of G is a bit noisy which is caused by mixing of the pilot-tone with the quantization noise around the pilot-tone.

Figure 11:
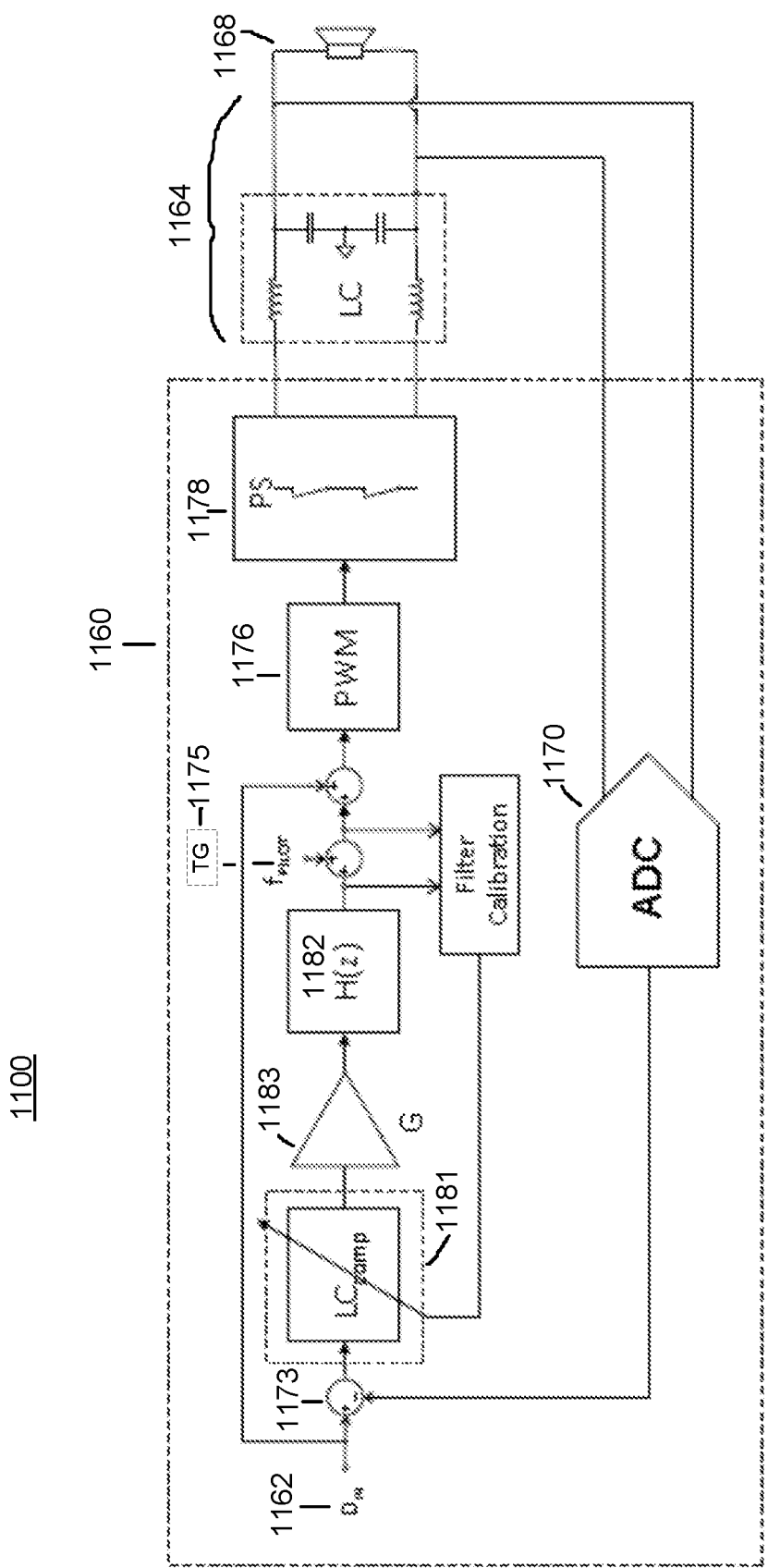
FIG. 11 is a system-level diagram illustrating an example class-D audio amplification circuit, in accordance with the present disclosure.

FIG. 11 illustrates yet another architecture and example embodiment in accordance with the instant disclosure. FIG. 11 shows an alternative (or additive aspect) to changing the gain in the loop to control the unity-gain frequency, and this is to (alternatively or also) change the zeros in the LC compensation filter, implemented as a variable LC compensation filter 1181, to realize the same unity-gain effect as discussed above. The other architecture/blocks in FIG. 11 are depicted using many of the same types of circuits and/or circuit functions shown in FIG. 1B (and thus similarly in FIGS. 4-8), as depicted using reference numerals in FIG. 11 which are similar to those in FIG. 1B (e.g., analog-digital conversion circuit (ADC) 170/1170, pulse-width modulator 176/1176, etc.). It will be appreciated that the gain (G) block or amplifier 1183 of FIG. 11 need not be variable when this approach is used as an alternative (but could be variable if used as an additive aspect).

More specifically, in FIG. 11 in case the unity-gain frequency of the main feedback loop is below the pilot-tone frequency (via tone generator 1175), correction can be realized by having the circuitry 1100 designed to decrease the frequency of the zeros in the LC-compensation filter. Conversely, if the unity-gain frequency of the main feedback loop is above the pilot-tone frequency, this can be corrected by increasing the frequency of the zeros in the LC-compensation filter. This approach has the added advantage that it does not affect the loop gain in the audio frequency band.

It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other types of depictions of circuits (e.g., whether or not using reference numerals or depicting a specific block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown by the sample and hold, adders, multipliers etc. in connection with the above Figures. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with injection of the control signal and ensuing discussion of unity-gain detection and calibration as may be used by a programmable circuit (e.g., CPU and/or FPLA circuitry) to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims

What is claimed is:

1. An amplifier circuit comprising:
a signal processing circuit including a signal combiner and a closed-loop feedback path, the signal processing circuit being configured and arranged to provide a loop transfer function for a derived signal representing at least in part contributions from an audio input signal, a control or pilot signal having a target frequency range and a calibration signal, with the signal combiner configured and arranged to combine aspects of the control or pilot signal and aspects of the audio input signal; and
a calibration circuit configured and arranged to adjust an effective gain of the derived signal in response to whether a unity-gain frequency of a signal in the closed-loop feedback path, as provided via the loop transfer function, is higher or lower than the target frequency range.

2. The amplifier circuit of claim 1, wherein the target frequency range is defined relative to the transfer function and an associated unity-gain frequency.

3. The amplifier circuit of claim 1, further comprising an impedance circuit configured and arranged to pass signals having frequencies in an audible frequency range and to block signals outside audible frequency range, and wherein the calibration circuit is configured and arranged to maintain stability of the closed-loop feedback path by adjusting the gain of the derived signal.

4. The amplifier circuit of claim 1, wherein the calibration circuit is further configured and arranged to change the DC-gain of the loop transfer function for maintaining stability of the closed-loop feedback path.

5. The amplifier circuit of claim 1, wherein the control or pilot signal is a single-frequency signal, and wherein the signal combiner is configured and arranged to sum the control or pilot signal with the audio input signal.

6. The amplifier circuit of claim 1, wherein the control or pilot signal is a single-frequency signal, and wherein the calibration circuit is further configured and arranged to adjust the gain in response to whether the frequency of the control or pilot signal is higher or lower than a unity-gain frequency provided by the loop transfer function.

7. The amplifier circuit of claim 1, wherein the calibration circuit includes circuitry for determining relative signal power levels of a processed signal in the signal processing circuit relative to contributions from the pilot signal.

8. The amplifier circuit of claim 1, wherein the calibration circuit includes first circuitry configured to determine relative signal power levels of a processed signal in the signal processing circuit relative to contributions from the control or pilot signal, and includes second circuitry configured to control and provide the gain in the closed-loop feedback path.

9. The amplifier circuit of claim 1, wherein the calibration circuit is further configured and arranged to adjust the gain toward convergence where the unity-gain frequency of the transfer function equals a frequency of a signal corresponding to the control or pilot signal.

10. The amplifier circuit of claim 1, wherein the signal processing circuit forms a class-D audio amplifier.

11. The amplifier circuit of claim 1, further including a variable-gain amplifier, wherein the calibration circuit includes at least one bandpass filter centered around a frequency of a signal corresponding to the control or pilot signal, and further including first circuitry configured to respond to an output from said at least one bandpass filter and to control and provide the gain, via the variable-gain amplifier, in response to determining relative signal power levels of a processed signal in the signal processing circuit relative to contributions from the control or pilot signal.

12. The amplifier circuit of claim 1, further including a variable-gain amplifier configured to provide an amplification (G) of the loop transfer function (H(s)), wherein the control or pilot signal is combined with the aspects of an audio signal feedback from the amplified loop transfer function (G*H(s)).

13. The amplifier circuit of claim 1, further including a variable-gain amplifier configured to provide an amplification (G) of the loop transfer function (H(s)), wherein the control or pilot signal is combined with the aspects of the audio signal after the amplification (G), along a forward-feed side after the amplified loop transfer function (G*H(s)).

14. The amplifier circuit of claim 1, further including a variable-gain amplifier configured to provide an amplification (G) of the loop transfer function (H(s)), wherein the control or pilot signal is combined with the aspects of the audio signal after the amplification (G), along a forward-feed side after the amplified loop transfer function (G*H(s)), wherein the calibration circuit having sample-and-hold circuitry and a signal-level comparator that are configured and arranged to determine relative signal power levels of a processed signal in the signal processing circuit relative to contributions from the pilot signal.

15. The amplifier circuit of claim 1, wherein the signal processing circuit includes circuitry corresponding to class-D audio amplification, and further includes:

a variable-gain amplifier configured to provide an amplification (G) of the loop transfer function (H(s)), wherein the control or pilot signal is combined with the aspects of the audio signal after an amplification (G) of the loop transfer function (G*H(s)), wherein the calibration circuit is configured to calibrate gain based on signal power levels assessed from contributions from the control or pilot signal;

a switching power stage configured and arranged to drive a speaker; and a low-pass filter configured to be coupled between the switching power stage and the speaker, and including a high-order digital filter having a high gain in audio bandwidth and a targeted behavior at unity-gain frequency, and including an impedance compensation filter, configured and arranged between a port receiving the audio input signal and the loop transfer function (H(s)), to cancel the transfer of a low-pass filter configured to suppress high-frequency content.

16. The amplifier circuit of claim 1, further including an impedance compensation filter configured and arranged with at least one zero, wherein the calibration circuit is further configured and arranged to adjust the effective gain by calibrating a transfer function provided by the impedance compensation filter and therein changing a frequency associated with said at least one zero.

17. The amplifier circuit of claim 16, wherein the impedance compensation filter includes components with inductive and capacitive contributions.

* * * * *